United States Patent
Yamada et al.

(10) Patent No.: US 6,991,506 B2
(45) Date of Patent: Jan. 31, 2006

(54) DISPLAY APPARATUS AND METHOD FOR FABRICATING THE SAME

(75) Inventors: Jiro Yamada, Kanagawa (JP); Tatsuya Sasaoka, Kanagawa (JP); Mitsunobu Sekiya, Tokyo (JP); Naoki Sano, Kanagawa (JP); Yasuhiro Chiba, Kanagawa (JP); Takashi Hirano, Kanagawa (JP); Yuichi Iwase, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/328,630

(22) Filed: Dec. 23, 2002

(65) Prior Publication Data

US 2003/0201708 A1   Oct. 30, 2003

Related U.S. Application Data

(62) Division of application No. 09/698,989, filed on Oct. 27, 2000, now Pat. No. 6,768,257.

(30) Foreign Application Priority Data

Oct. 28, 1999   (JP) .............................. P11-306245

(51) Int. Cl.
   *H01J 9/00*       (2006.01)

(52) U.S. Cl. ........................................................ 445/24
(58) Field of Classification Search ............. 445/23–25
   See application file for complete search history.

(56) References Cited

U.S. PATENT DOCUMENTS

| 5,601,468 A | * | 2/1997 | Fujii et al. ..................... 445/24 |
| 6,099,746 A | * | 8/2000 | Kim ............................ 427/66 |
| 6,281,552 B1 | * | 8/2001 | Kawasaki et al. .......... 257/350 |
| 6,384,529 B2 | * | 5/2002 | Tang et al. .................. 313/506 |
| 2001/0009351 A1 | * | 7/2001 | Hosokawa et al. ......... 313/504 |

* cited by examiner

*Primary Examiner*—Joseph Williams
(74) *Attorney, Agent, or Firm*—Sonnenschein, Nath & Rosenthal LLP (57) ABSTRACT

An active-matrix-type display apparatus ensuring sufficient luminous intensity of display devices within a display plane and allowing improved display properties is provided. Such display apparatus having of a plurality of pixels comprises a lower electrode formed on a substrate; organic layers formed on the lower electrode; and an upper common electrode formed on the organic layers; in which a plurality of the pixels are partitioned by a rib larger in the thickness than the organic layers and having at least a conductive material layer; and the conductive material layer is electrically connected to the upper common electrode.

18 Claims, 9 Drawing Sheets

DISPLAY APPARATUS AND METHOD FOR FABRICATING THE SAME

RELATED APPLICATION DATA

The present application claims priority to Japanese Application No. P11-306245, filed Oct. 28, 1999, and is a divisional of U.S. application Ser. No. 09/698,989, filed Oct. 27, 2000 now U.S. Pat. No. 6,768,257, both of which are incorporated herein by reference to the extent permitted by law.

BACKGROUND OF THE INVENTION

1. Field of the Invention

The present invention relates to a display apparatus which comprises organic electro-luminescence devises individually having an organic light emitting layer, and a method for fabricating such display apparatus.

2. Description of the Related Art

An organic electro-luminescence (abbreviated as EL hereinafter) device based on electro-luminescence of organic materials has an organic layer comprising an organic hole transport layer and an organic light emitting layer laminated between a lower electrode and an upper electrode, and is attracting a good deal of attention as a light emitting device capable of high-luminance light emission by low-voltage direct current drive.

Since such an organic EL device can respond as fast as within 1 μsec or below, an organic EL display apparatus using such devices can be driven by simple-matrix duty operation. A problem will, however, arise in that there is a growing need for instantaneously applying a large current to the organic EL devices to ensure sufficient luminous intensity in the future situation in which the EL display apparatus will be operated at a higher duty responding to an increasing trend in the number of pixels, which is likely to damage the devices.

On the other hand in active-matrix operation, operation current can constantly be applied to the organic EL devices during a period of one frame according to signal voltage, since the signal voltage can be retained by a retention capacitor provided to the individual pixels together with a thin film transistor (abbreviated as TFT hereinafter). Thus, unlikely to a case with the single matrix operation, there is no need to instantaneously apply a large current so that the damages to the organic EL devices can be reduced.

In the active-matrix display apparatus using such organic EL devices (that is, the organic EL display), each pixel on a substrate is individually provided with a TFT, the TFTs are covered with an interlayer insulating film, and further thereon organic EL devices are formed. Each organic EL device comprises a lower electrode patterned for the individual pixels so as to be connected to the TFT, an organic layer formed so as to cover the lower electrode, and an upper electrode provided so as to cover the organic layer.

In such an active-matrix display apparatus, the upper electrode is formed as a so-called blanket film covering all pixels, and used as an upper common electrode for such all pixels. In the display apparatus capable of color display, the organic layers are separately patterned for each color on the lower electrode.

Such display apparatus having organic EL devices on the insulating film covering the TFTs on the substrate is, however, disadvantageous in that such TFTs are causative of narrowing the aperture of the organic EL devices when the display apparatus is designed as of transmission type in which light emitted from the organic layer is observed from the substrate side.

Thus for the active-matrix display apparatus, it is supposed to be advantageous to adopt a so-called upper light withdrawing structure (hereinafter referred to as top emission type) in which the light is withdrawn from an opposite side of the substrate so as to ensure a sufficient aperture of the organic EL devices.

Constituting the active-matrix display apparatus as the top emission type requires the lower electrode to be made of a light reflective material and the upper common electrode to be made of a transparent material. Indium tin oxide (ITO) and indium zinc oxide (IXO), known as materials for transparent conductive film, are however higher in resistivity than metals, so that the upper common electrode is likely to cause voltage drop due to internal voltage gradient occurs therein. This may cause significant degradation of the display properties since the voltage applied to the individual organic EL devices on the display plane becomes non-uniform, and since the luminous intensity in the center portion of the display plane decreases.

While the transparent conductive film such as ITO or IXO can be formed by evaporation or sputtering, the former method is difficult to yield a film of good quality, and the obtained film tends to have high resistivity and low light transmissivity. The sputtering is thus adopted in the fabrication process of the display apparatus to form the transparent conductive film. The sputtering is, however, higher in energy of particles to be deposited as compared with vapor deposition, so that the underlying surface on which the deposition proceeds is more likely to be damaged. Since the basic structure of the organic EL device resembles to that of a light emitting diode made of inorganic semiconductor materials, such damages exerted on the underlying organic layer will be causative of leak current, which may further result in the production of non-emissive pixels called "dead pixels".

To avoid the production of such dead pixels, it is proposed to form the upper common electrode with a metal film thin enough so as to allow sufficient light transmissivity. Such metal film may, however, inevitably has a high sheet resistance as a result of the thinning and will also produce voltage gradient in the upper common electrode similarly to the case with the transparent conductive film, which will cause voltage drop and thus will significantly lower the display properties.

The thinning of the upper common electrode raises another problem in that the electrode cannot fully prevent the atmospheric moisture or oxygen from intruding into the organic layer, which will accelerate deterioration of the organic layer.

SUMMARY OF THE INVENTION

It is therefore an object of the present invention to provide an active-matrix-type display apparatus ensuring sufficient luminous intensity of the organic EL devices and allowing improved display properties.

To accomplish the foregoing object, a first aspect of the present invention relates to a display apparatus having a plurality of pixels, which comprises:

a first electrode formed on a substrate;

a light emitting layer formed on the first electrode; and a second electrode formed on the light emitting layer, wherein:

the plurality of pixels are partitioned by a rib larger in thickness than the light emitting layer and having at least a conductive material; and the conductive material layer is electrically connected to the second electrode.

Since the rib having the conductive material serves as an auxiliary wiring for the second electrode, the pressure drop of the second electrode can successfully be suppressed and thus sufficient luminous intensity of the organic light emitting layer of the individual pixels can be retained even when the second electrode is made of a high-resistivity material. Moreover, the rib also serves as a spacer for a mask used for patterning the organic layer, so that there is no need to separately provide the spacer and the auxiliary wiring between every adjacent pixels. This allows space saving between every adjacent pixels and reserve of the pixel area.

According to a second aspect of the present invention, there is provided a display apparatus having a plurality of pixels, which comprises:

a field effective transistor formed on a substrate and having a first electrode, a second electrode and a third electrode;

an interlayer insulating film formed on the field effective transistor;

a lower electrode connected to the first electrode through an opening formed on the interlayer insulating film;

an organic layer formed on the lower electrode and having a light emitting layer; and an upper electrode formed on the organic layer, wherein:

the plurality of pixels are partitioned by a rib larger in thickness than the organic layer and having at least a conductive material; and the conductive material layer is electrically connected to the upper electrode.

According to the display apparatus according to the second aspect of the present invention, sufficient luminous intensity of the organic light emitting layer of all pixels on the display plane can be retained while achieving the space saving between every adjacent pixels to reserve sufficient pixel area by providing between every adjacent pixels the rib which serves as the spacers for the mask used for patterning the organic layer and also as the auxiliary electrode for the upper electrode covering the entire plane of the display plane. This results in improvement in the display properties of an active-matrix-type display apparatus.

According to a third aspect of the present invention, there is provided a method for fabricating a display apparatus having a plurality of pixels, which comprises:

a step for forming on a substrate a first electrode;

a step for forming between adjacent ones of the plurality of pixels a rib having a conductive material;

a step for placing a mask on the rib, and forming on the first electrode a light emitting layer smaller in thickness than the rib; and a step for forming a second electrode on the light emitting layer and on the rib.

According to a fourth aspect of the present invention, there is provided a method for fabricating a display apparatus having a plurality of pixels, which comprises:

a step for forming on a substrate a field effective transistor having a first electrode, a second electrode and a third electrode;

a step for forming on the field effective transistor an interlayer insulating film;

a step for forming an opening to the interlayer insulating film;

a step for forming on the interlayer insulating film a lower electrode connected through the opening to the first electrode;

a step for forming between adjacent ones of a plurality of the pixels a rib having a conductive material;

a step for placing a mask on the rib, and forming on the lower electrode an organic layer having a light emitting layer smaller in thickness than the rib; and a step for forming on the organic layer an upper electrode and a protective layer made of an insulating material or a conductive material while keeping the organic layer unexposed to the air.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENT

The present invention will be detailed referring to the attached drawings.

Figure 1:
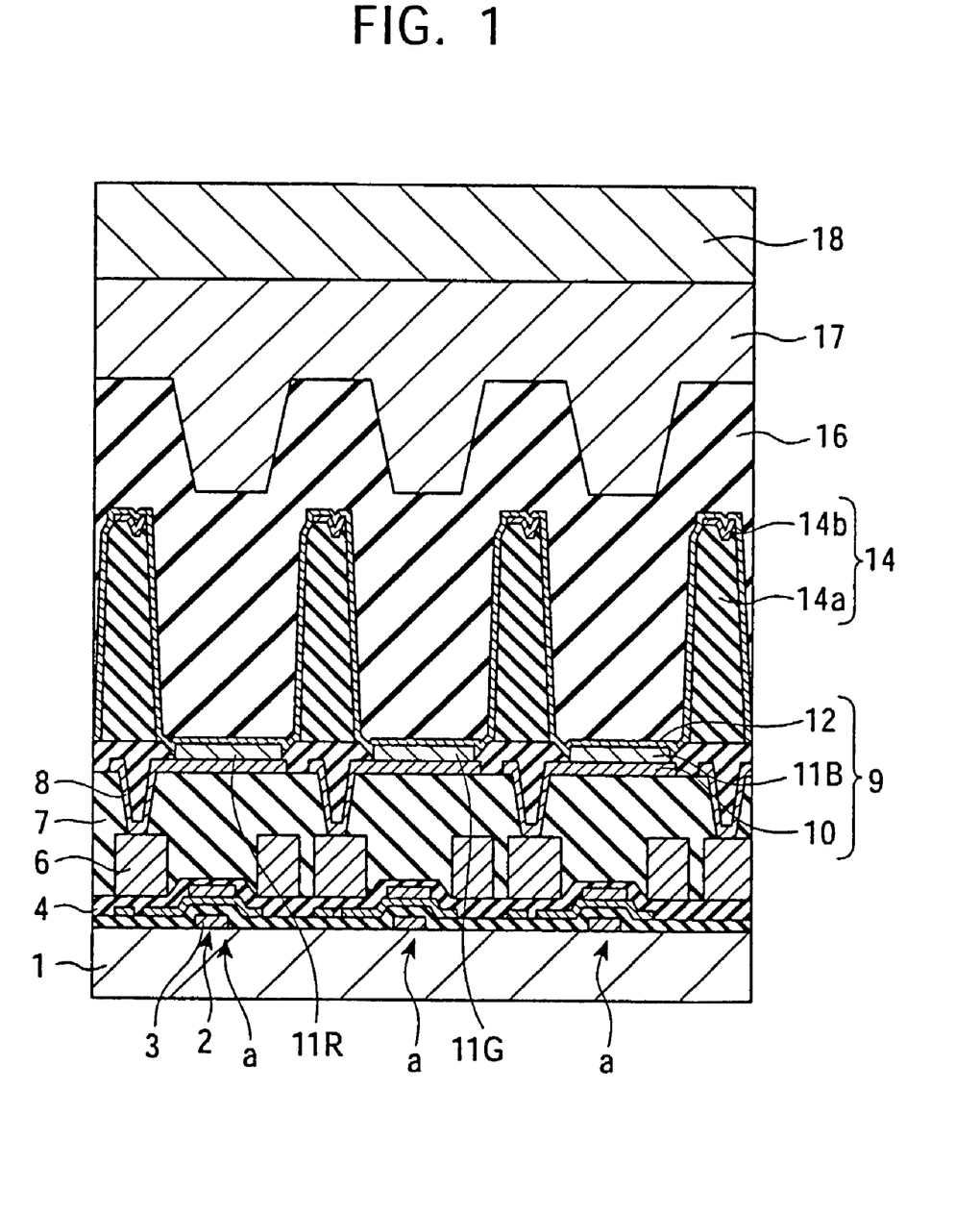
FIG. 1 is a sectional view of an essential part of a display apparatus according to an embodiment of the present invention.
Figure 2:
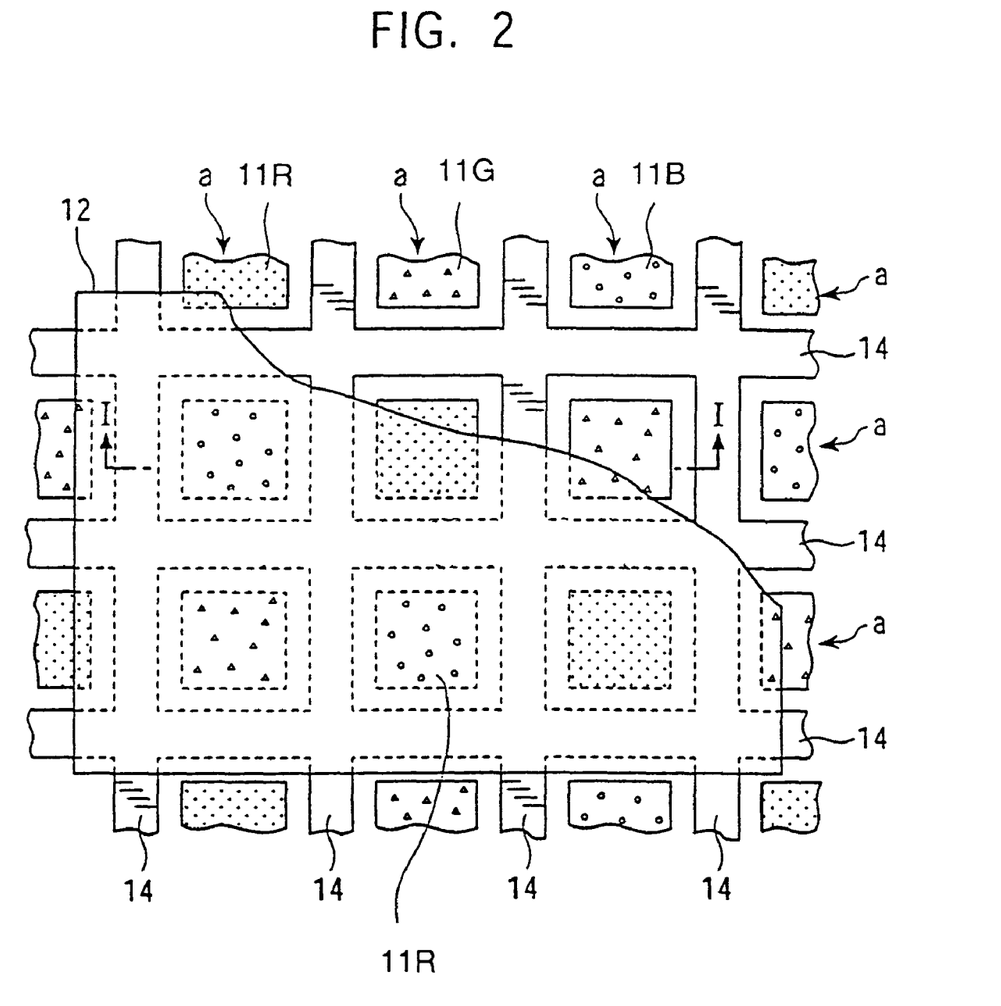
FIG. 2 is a plan view of an essential part of a display apparatus for explaining the embodiment of the present invention.

FIG. 1 is a schematic sectional view showing a display area of a display apparatus according to an example of the present invention. FIG. 2 is a schematic plan view showing the display area of the display apparatus shown in FIG. 1. FIG. 1 is a view in section along the line I—I in FIG. 2. Among various structural components which will be explained hereinafter in order from those closer to the lower layer side, FIG. 1 now shows only organic layers 11R, 11G, 11B, an upper common electrode 12 and ribs 14. The organic EL display apparatus shown in these figures is an active-matrix-type color display apparatus, the constitution of which will be explained with reference also to additional drawings of FIGS. 3A, 3B, 3C, 4, 5A, 5B. 5C, 6 and 7 following the fabrication procedures thereof.

Figure 3A:
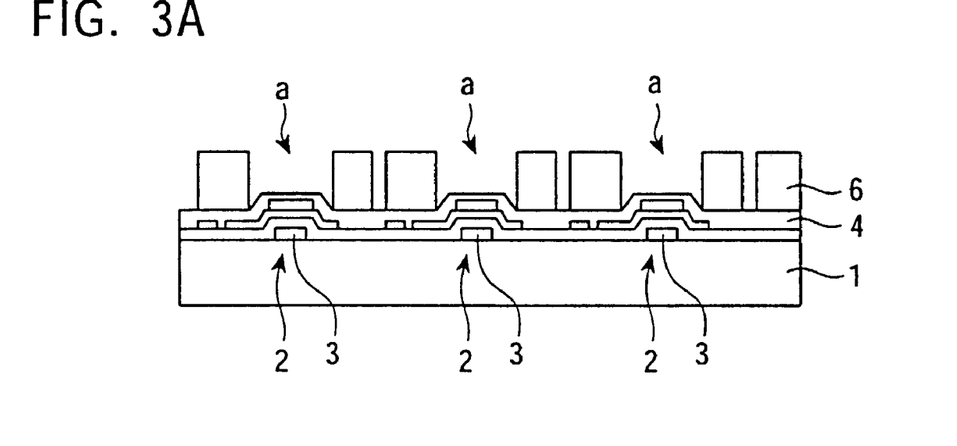
FIGS. 3A to 3C are sectional views for explaining a fabrication process of the display apparatus shown in FIGS. 1 and 2.

First as shown in FIG. 3A, a thin-film transistor 2 is fabricated for every pixel "a" on a substrate 1. A gate electrode 3 of the thin-film transistor 2 is connected to a scan circuit not shown. While the thin-film transistor 2 in this figure is expressed as a bottom-gate-type, a thin-film transistor of a top-gate-type is also allowable. For a case that the display device is of top emission type in which emitted light is observed from the opposite side of the substrate 1, the substrate 1 needs not be limited to those made of transparent materials. Whereas for a case that the display device is of transmission type in which emitted light is observed from the substrate 1 side, the substrate 1 needs be made of a transparent material.

Next, on the substrate 1, a first interlayer insulating film 4 made of silicon oxide or a silicon oxide-base material such as PSG (phospho-silicate glass), that is phosphorus-containing silicon oxide, is formed so as to cover the thin-film transistor 2. The first interlayer insulating film 4 is then processed to form via holes (not shown) thereon, a wiring 6 is then patterned on the first interlayer insulating film 4 so as to make contact with a source/drain region of the thin-film transistor 2 through the via hole. The wiring 6 is used for a signal line and is made, for example, of aluminum or aluminum-copper alloy.

Figure 3B:
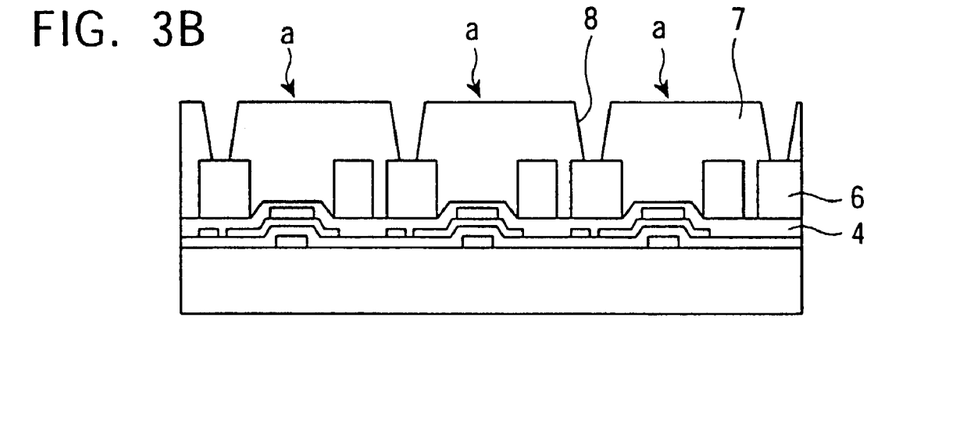

Next, as shown in FIG. 3B, a second interlayer insulating film 7 is formed on the first interlayer insulating film 4 so as to cover the wiring 6, and the second interlayer insulating film 7 is then processed to form via holes 8 thereon, the bottom of which reaches the wiring 6. The second interlayer insulating film 7 is preferably made of a material film which can readily be planarized such as polyimide film since the film covers the patterned wiring 6. The second interlayer insulating film 7 is also preferably made of a material film with a small coefficient of water absorption since the second interlayer insulating film 7 is expected to prevent moisture-related deterioration of an organic layer formed later and thereby to retain desirable luminous intensity.

Thereafter as shown in FIG. 1, organic EL devices 9 are formed on the second interlayer insulating film 7 so as to be aligned to the individual pixels "a". Each of the EL devices 9 comprises a lower electrode 10, organic layers 11R, 11G or 11B, and an upper common electrode 12 stacked in this order.

Figure 3C:
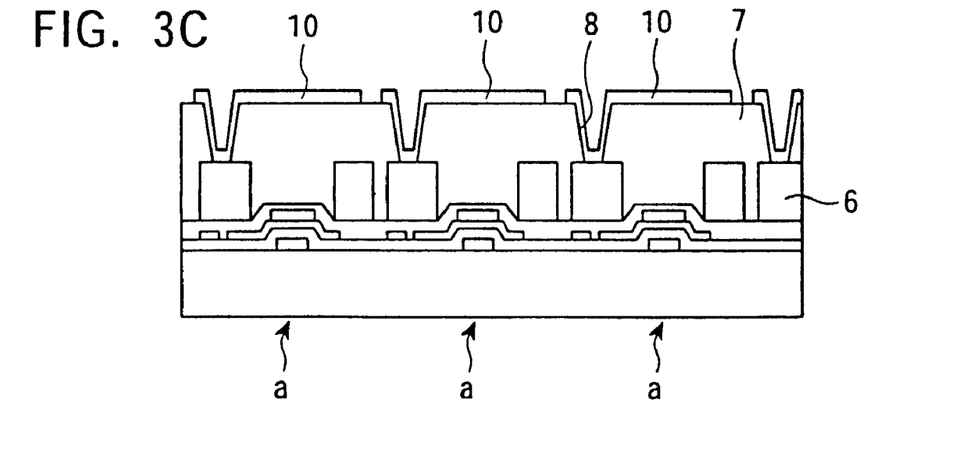

More specifically, first as shown in FIG. 3C, the lower electrode 10 patterned for every pixel "a" is formed on the second interlayer insulating film 7 so as to make contact with the wiring 6 through the via hole 8 formed to the second interlayer insulating film 7. The lower electrode 10 is used as an anode electrode or a cathode electrode, which is made of a highly reflective material when the display apparatus is designed as a top emission type, whereas made of a transparent material for the display apparatus of transmission type.

The exemplary display apparatus shown here is a top emission type, in which the lower electrode 10 is used as an anode electrode. The lower electrode 10 is made of a conductive material having a large work function and a large reflectivity of light, such as chromium (Cr), iron (Fe), cobalt (Co), nickel (Ni), copper (Cu), tantalum (Ta), tungsten (W), platinum (Pt) or gold (Au).

For a case that the display apparatus is of the top emission type and the lower electrode 10 is used as a cathode electrode, the lower electrode 10 is made of a conductive material having a small work function but a large reflectivity of light, such as aluminum (Al), indium (In), magnesium (Mg)-silver (Ag) alloy, lithium (Li)-fluorine (F) compound or lithium-oxygen (O) compound.

For a case that the display apparatus is of a transmission type and the lower electrode 10 is used as an anode electrode, the lower electrode 10 is made of a conductive material having a large work function and a large transmissivity of light such as ITO or IXO. For a case that the display apparatus is of the transmission type and the lower electrode 10 is used as a cathode electrode, the lower electrode 10 is made of a conductive material having a small work function and a large transmissivity of light.

Figure 4:
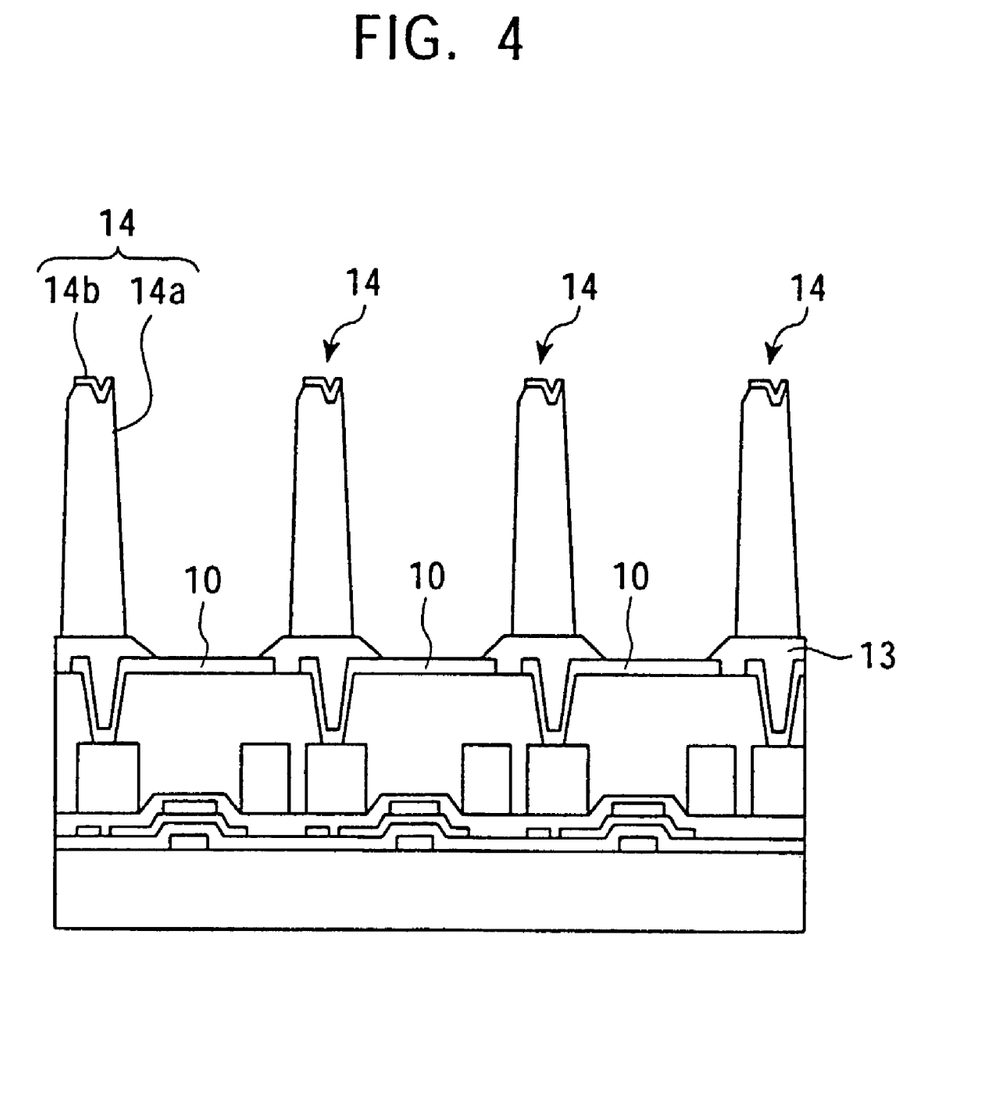
FIG. 4 is a sectional view for explaining the fabrication process as continued from FIG. 3C.

Next, as shown in FIG. 4, an insulating film 13 is formed on the second interlayer insulating film 7 so as to cover the periphery of the lower electrode 10. Thereby the lower electrode 10 is exposed in a window opened to the insulating film 13. The insulating film 13 is made, for example, of silicon oxide.

Next on the insulating film 13, a rib 14, which is a unique component in the present invention, is formed. The rib 14 is composed of an insulating material layer 14a and a conductive material layer 14b stacked thereon, and is formed in a lattice pattern so as to partition the individual pixels "a" over the entire display area (see FIG. 2), and the upper conductive material layer 14b is used as an auxiliary wiring which will be connected to the upper common electrode 12 (see FIG. 1) patterned later. The insulating material layer 14a now can be made of an organic insulating material such as polyimide or photoresist, or an inorganic insulating material such as silicon oxide. The conductive material layer 14b can be made of a low-resistivity conductive material such as aluminum (Al) or chromium (Cr), which may be used individually or in combination.

The rib 14 is formed so that the top surface of which is higher in the level than those of the organic layers 11R, 11G and 11B (see FIG. 1). Such designing of the rib 14 allows it to serve as a spacer for a mask used when evaporating the organic layers 11R, 11G and 11B on the lower electrode 10 as described in the next process.

The rib 14 has tapered side walls so as to ensure desirable coverage of the upper common electrode 12 covering such a rib 14 having a certain level of height as described above.

Figure 5A:
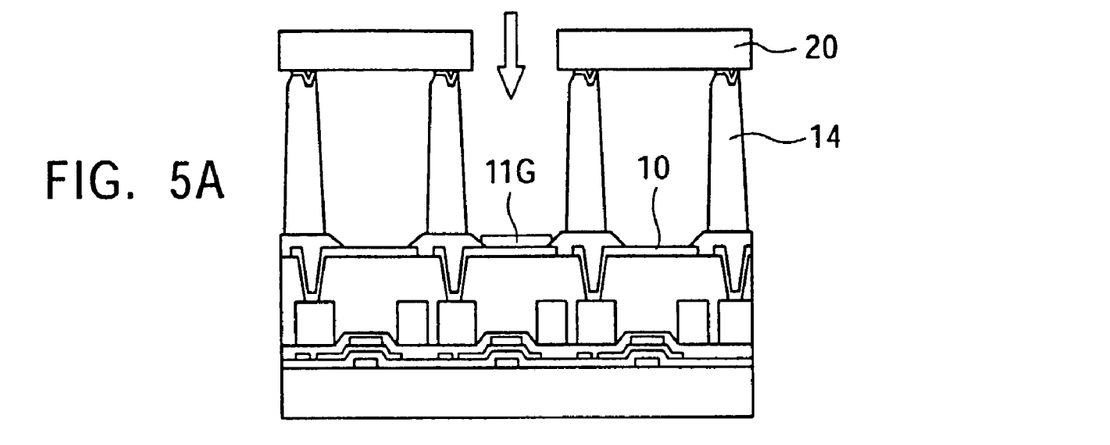
FIGS. 5A to 5C are sectional views for explaining the fabrication process as continued from FIG. 4.
Figure 5B:
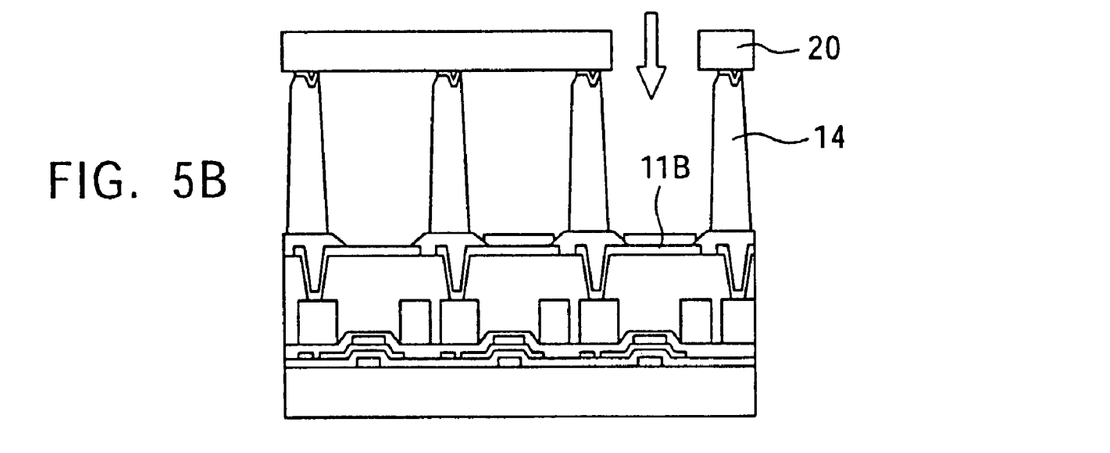
Figure 5C:
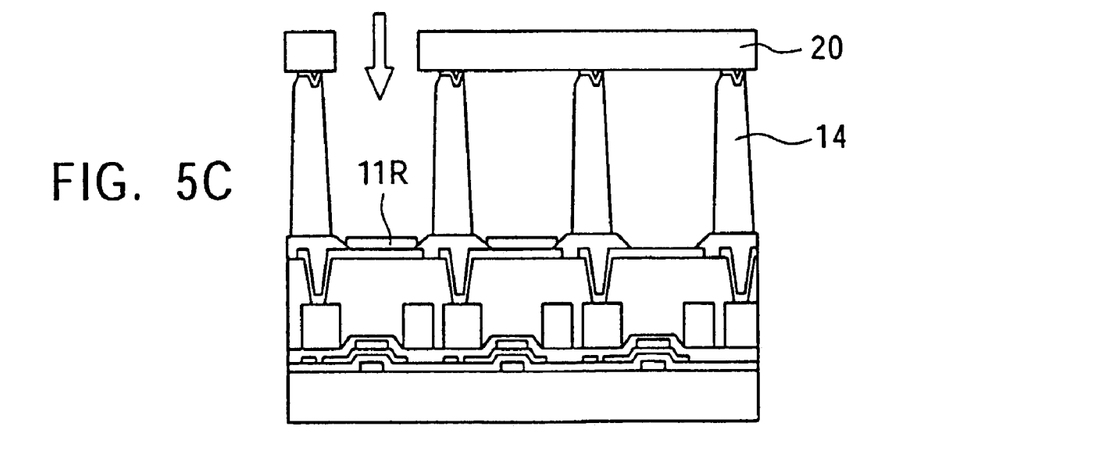

Next, as shown in FIGS. 5A, 5B and 5C, the organic layers 11R, 11G and 11B corresponded to each emission color are successively formed on the lower electrode 10 for each pixel "a". More specifically, a metal mask 20 having openings arranged in a pattern corresponded to each color of the pixels is placed on the rib 14 as a spacer, and the individual organic layers 11R, 11G, 11B are successively evaporated on the lower electrode 10. The individual organic layers 11R, 11G, 11B are formed so as to fully cover the exposed portion of the lower electrode 10, and are practically composed of, although not shown in the figure, an organic hole transport layer, an organic light emitting layer and an optional organic electron transport layer stacked, as occasion arises, in this order from the lower electrode 10 side.

A specific example of formation processes of the individual organic layers 11R, 11G, 11B will be detailed hereinafter.

First as shown in FIG. 5A, the metal mask 20 is placed so that the openings thereof are aligned to the pixels "a" responsible for green light emission, and organic materials are evaporated assisted by resistance heating. That is, a hole injection layer of 25 nm thick is formed by evaporating m-MTDATA [4,4',4"-tris(3-methylphenylphenylamino)triphenylamine], a hole transport layer of 30 nm thick is formed by evaporating α-NPD [4,4-bis(N-1-naphthyl-N-phenylamino)biphenyl], and a light emitting layer of 50 nm thick also serves as an electron transport layer is formed by evaporating Alq3 [tris(8-quinolinolato)aluminium (III)]. These three layers are evaporated in a continuous manner within a single chamber of an evaporation apparatus.

Next as shown in FIG. 5B, the metal mask 20 is placed so that the openings thereof are aligned to the pixels "a" responsible for blue light emission, and organic materials are evaporated assisted by resistance heating. That is, a hole injection layer of 18 nm thick is formed by evaporating m-MTDATA, a hole transport layer of 30 nm thick is formed by evaporating for example α-NPD, a light emitting layer of 14 nm thick also serves as a hole blocking layer is formed by evaporating Bathocuproine (2,9-dimethyl-4,7-diphenyl-1,10-phenanthroline), and a light emitting layer of for example 30 nm thick is formed by evaporating Alq3. These four layers are evaporated in a continuous manner within a single chamber of an evaporation apparatus.

Further as shown in FIG. 5C, the metal mask 20 is placed so that the openings thereof are aligned to the pixels "a" responsible for red light emission, and organic materials are evaporated assisted by resistance heating. That is, a hole injection layer of 55 nm thick is formed by evaporating m-MTDATA, a hole transport layer of 30 nm thick is formed by evaporating for example α-NPD, a light emitting layer is formed by evaporating BSB-BCN [2,5-bis {4-(N-methoxyphenyl-N-phenylamino)styryl}benzene-1,4-dicarbonitrile], and an electron transport layer of 30 nm thick is formed by evaporating Alq3. These four layers are evaporated in a continuous manner within a single chamber of an evaporation apparatus.

Figure 6:
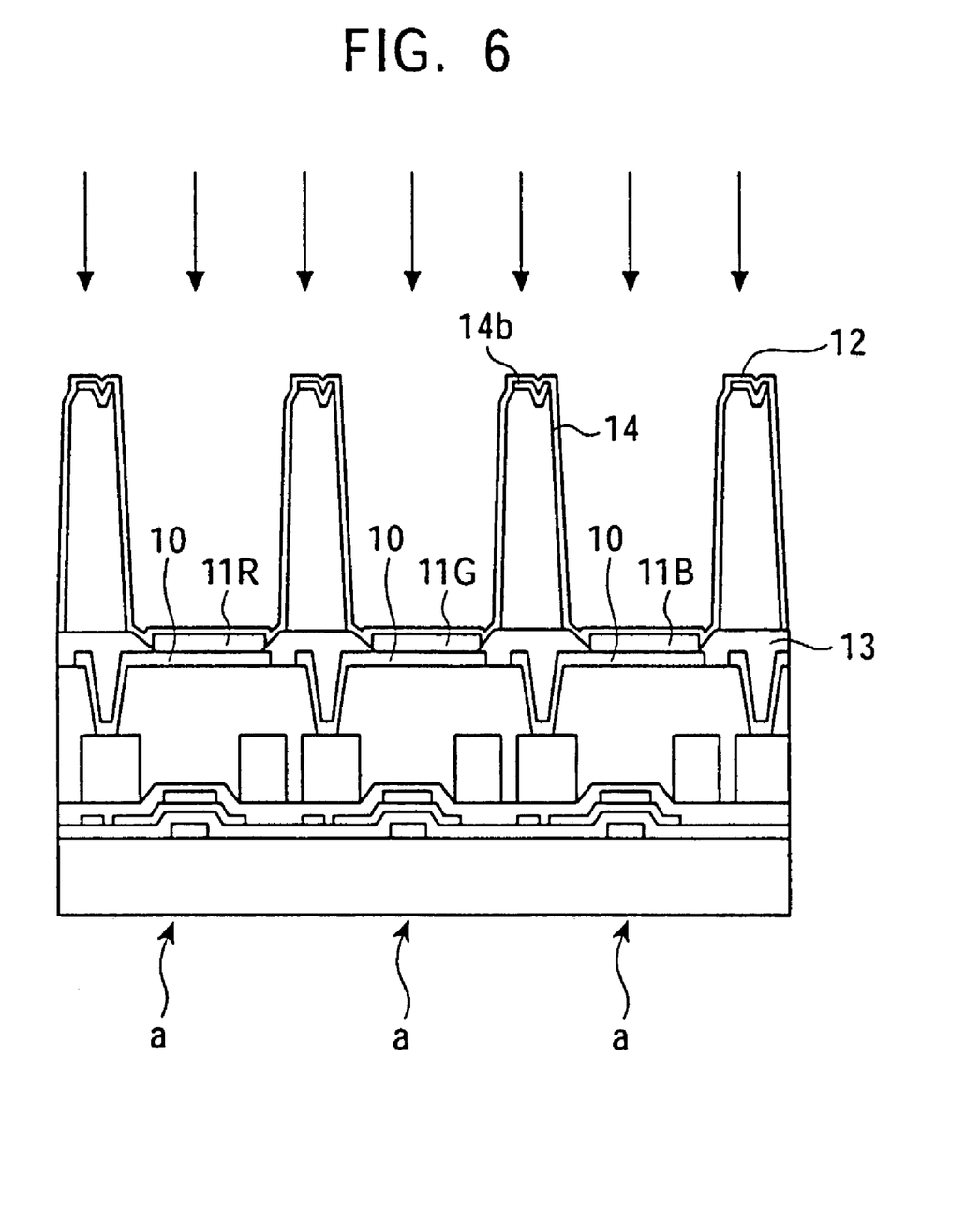
FIG. 6 is a sectional view for explaining the fabrication process as continued from FIG. 5C.

After the organic layers 11R, 11G, 11B are thus formed, an upper common electrode 12 is commonly formed for all pixels so as to cover the entire surface of the display area as shown in FIG. 6. The upper common electrode 12 is formed so as to cover the rib 14 having the tapered side walls and so as to be connected to the conductive material layer 14b composing the upper portion of the rib 14, but isolated from the lower electrode 10 by the organic layers 11R, 11G, 11B and the insulating film 13.

The upper common electrode 12 is used as an anode electrode or a cathode electrode, and is made of a transparent material when the display apparatus is designed to be of the top emission type, whereas made of a highly reflective material when the display apparatus is designed to be of the transmission type. The upper common electrode 12 is preferably formed by a method such as evaporation or chemical vapor deposition, in which energy of particles to be deposited is small enough to avoid adverse influences on the underlying layer. It is also preferable to form the upper common electrode 12 successively from the processes for forming the organic layers 11R, 11G, 11B in the same chamber of the deposition apparatus, so as to avoid deterioration of the organic layers 11R, 11G, 11B due to the atmospheric moisture.

In such constitution of the display apparatus of top emission type having the lower electrode 10 serves as an anode electrode, the upper common electrode 12 is used as a cathode electrode. It is now preferable to form the upper common electrode 12 with a transparent material having a small work function, so as to allow efficient injection of electrons into the organic layers 11R, 11G, 11B, and more preferably with a metal film which can be formed by a film forming method such as vapor deposition in which energy of particles to be deposited is relatively small. The upper common electrode 12 is now formed with a metal film such as Mg—Ag alloy high in light transmissivity and preferably having that of 30% or above, which can be attained by forming the Mg—Ag alloy in a thickness of 14 nm.

When the lower electrode 10 is used as a cathode electrode, the upper common electrode 12 serves as an anode electrode. The upper common electrode 12 in such a case is preferably made of a transparent material having a large work function, and preferably made of a metal film which can be formed by evaporation method.

On the other hand, when the display apparatus is of transmission type and the upper common electrode 12 is used as a cathode electrode, the upper common electrode 12 is made of a conductive material having a small work function and a high light reflectivity. When the display apparatus is of transmission type and the upper common electrode 12 is used as an anode electrode, the upper common electrode 12 is made of a conductive material having a large work function and a high light reflectivity.

Figure 7:
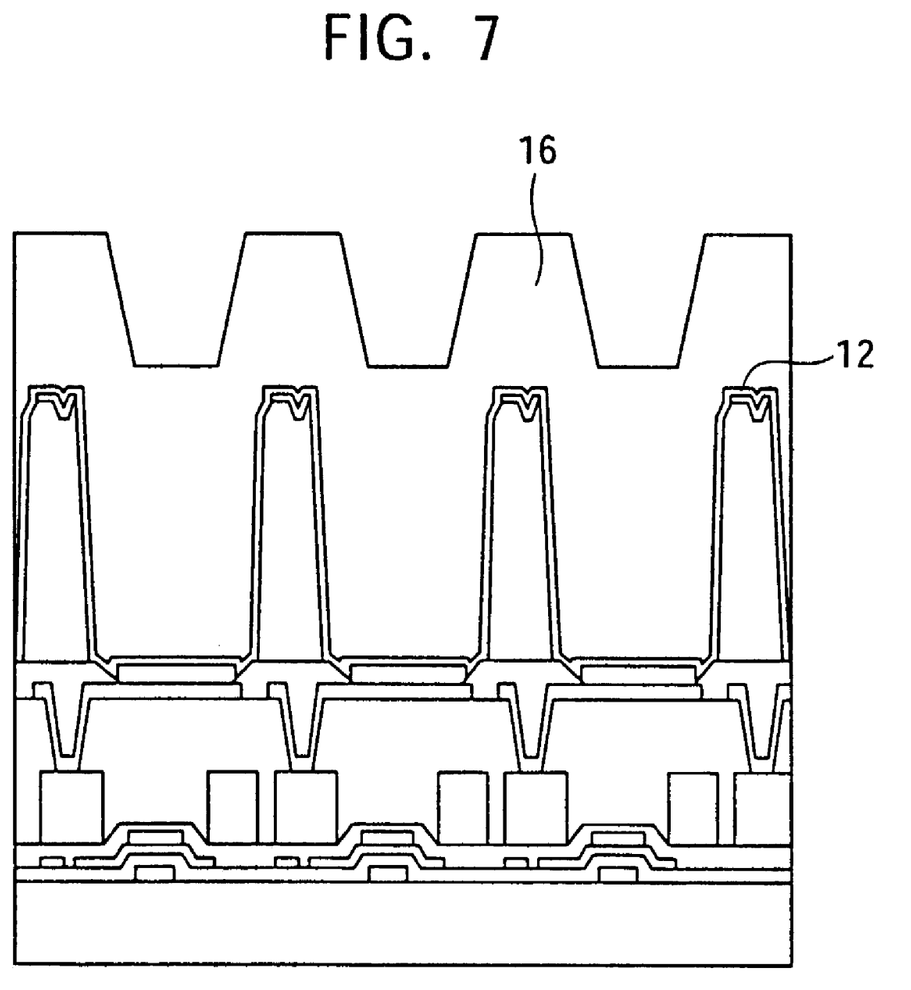
FIG. 7 is a sectional view for explaining the fabrication process as continued from FIG. 6.

After that as shown in FIG. 7, a conductive or insulating protective film 16 is formed on the transparent upper common electrode 12 made of a thin metal film. The protective film 16 is now formed by a method such as evaporation or chemical vapor deposition, in which energy of particles to be deposited is small enough to avoid adverse influences on the underlying layer. It is also preferable to form the protective film 16 successively from the processes for forming the upper common electrode 12 in the same chamber of the deposition apparatus without exposing the upper common electrode 12 to the atmosphere. Thus the protective layer 16 is formed while preventing the organic layers 11R, 12G and 11B from being degraded due to the atmospheric oxygen or moisture.

The protective film 16 is further intended for preventing the moisture from reaching the organic layers 11R, 11G and 11B, so that the film 16 needs be made of a material low in moisture permeability and moisture absorption, and made to have a sufficient thickness. When the display apparatus is of the top emission type, the protective film 16 needs be made of a material allowing light emitted from the organic layers 11R, 11G and 11B to pass through, and preferably has a light transmissivity of 80% or above.

In particular in this case, the protective film 16 is formed using an insulating material. That is, the insulating protective film 16 is directly formed on the upper common electrode 12 simply made a single thin metal film.

Preferable material for composing such a protective film 16 include inorganic amorphous insulating materials such as amorphous silicon (α-Si), amorphous silicon carbide (α-SiC), amorphous silicon nitride (α-$Si_{1-x}N_x$) and amorphous carbon (α-C). Such inorganic amorphous insulating materials can compose an excellent protective film 16 due to their low moisture permeability by virtue of their grain-free texture.

For a case that amorphous silicon nitride is intended as a material for the protective film 16, the film is formed by the CVD method in a thickness of 2 to 3 μm. It is now preferable to set the film forming temperature at the normal temperature so as to avoid lowering in the luminous intensity due to deterioration of the organic layers 11R, 11G, 11B, and it is also preferable to form the protective film 16 under a condition allowing the film stress to be minimized so as to avoid peel-off of the protective film 16.

For a case that the protective film 16 is made with a conductive material, a transparent conductive material such as ITO or IXO can properly be used.

After the protective film 16 is thus formed, a glass substrate 18 is optionally fixed thereon using an ultraviolet curing resin layer 17 as shown in FIG. 1, thereby to finish the display apparatus.

In the thus fabricated organic EL display, the upper common electrode 12 is connected with the rib 14 provided over the entire area of the display plane and serving as an auxiliary wiring therefore, so that the voltage gradient of the upper common electrode 12 formed so as to blanket the display plane can be suppressed, thereby to prevent the voltage drop. This successfully ensures sufficient luminous intensity of the organic EL device 9 provided for each pixel "a" in the display plane.

In particular in the display apparatus of the top emission type, the sheet resistance of the upper common electrode 12 will rise if it is made of a thin metal film allowing the light emitted from the organic layers 11R, 11G, 11B to pass through. The conductive material layer 14b of the rib 14 can, however, serve as an auxiliary wiring for the upper common electrode 12 and can suppress the voltage gradient of such upper common electrode 12 within the display plane, so that the voltage drop at around the center of the display plane can be suppressed.

Such constitution allows sufficient luminous intensity of the organic EL device 9 provided for the individual pixels "a" within the display plane, even if the protective film 16 made of an insulating material is directly formed on the upper common electrode 12 made of a thin metal film. Such upper common electrode 12 made of a thin metal film and the protective film 16 made of an insulating material can be formed by a method such as evaporation or chemical vapor deposition, in which energy of film-forming particles to be deposited is small enough to avoid adverse influences on the underlying layer, so that damages to the organic layers 11R, 11G, 11B can be avoided. This will prevent leak current from being generated, and will thus prevent the production of non-emissive pixels called "dead pixels" from being produced.

Moreover, since the rib 14 is used not only as the auxiliary wiring but also as the spacer for the mask 20 used for patterning the organic layers 11R, 11G, 11B, there is no need to separately provide the spacer and the auxiliary wiring between every adjacent pixels "a". This allows space saving between every adjacent pixels "a" and reserve of the pixel area. This successfully results in improving the display property of the active-matrix organic EL display apparatus of the top emission type.

Connecting the auxiliary wiring (rib 14) to the high-resistivity upper common electrode 12 also allows power saving of the display apparatus, and ensures desirable display property. This is also beneficial in that retaining desirable display property since heat generation from the upper common electrode 12 can be suppressed and thus the organic layers 11R, 11G, 11B can be prevented from being degraded.

The rib 14 has a double-layered structure composed of the insulating material layer 14a and the conductive material layer 14b stacked thereon, and the height of the rib 14 sufficient for functioning as a spacer is ensured by the insulating material layer 14a. Thus the rib 14 required to have a certain height can readily be formed without producing etching residual of the conductive material layer 14b.

Figure 8:
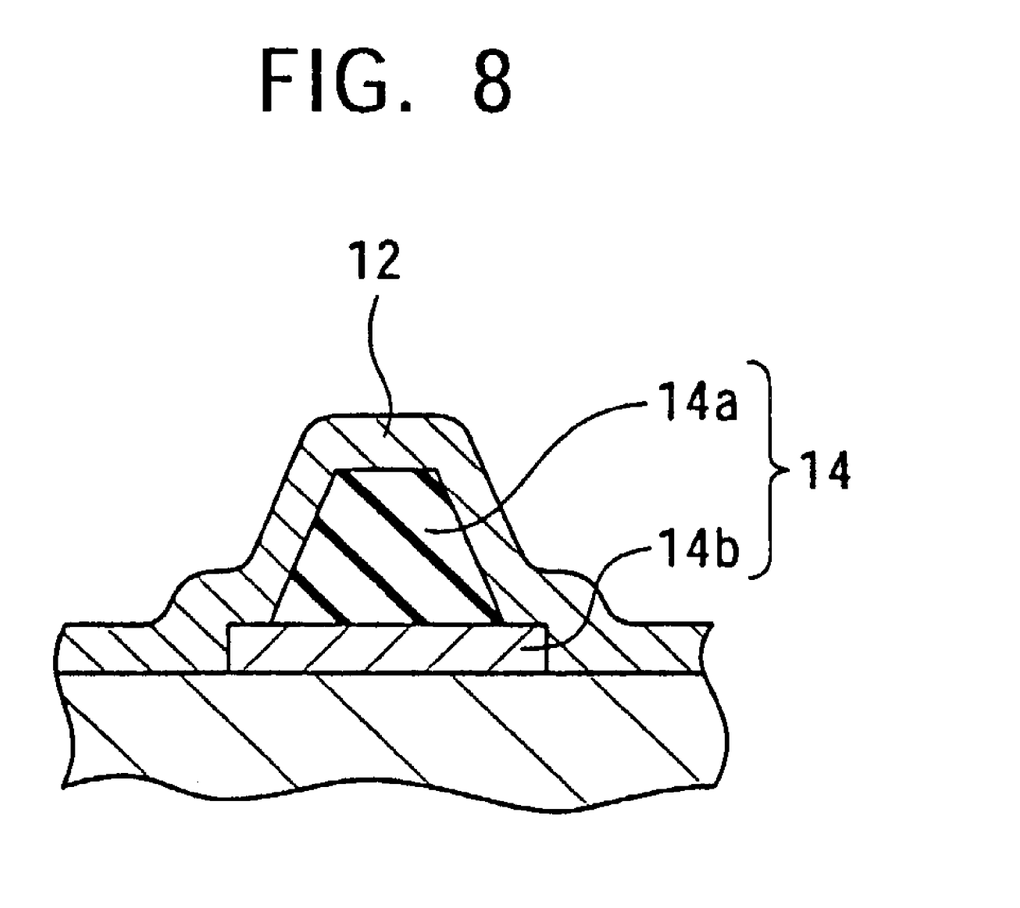
FIG. 8 is a sectional view of an exemplary constitution of a rib.

While in the above embodiment the rib 14 was explained as such that a double-layered structure in which the conductive material layer 14b is stacked on the insulating material layer 14a, the rib 14 may also be composed of another double-layered structure in which the insulating material layer 14a is stacked on the conductive material layer 14b as shown in FIG. 8. While being not shown, the surface of the insulating material layer may be covered with a conductive material layer, or the rib 14 may be composed only of a conductive material layer. Composing the rib 14 only of the conductive material layer allows the rib 14 and the upper common electrode 12 connected thereto to be lowered in the resistivity.

It is preferable that the rib 14 of any constitution described above preferably has the tapered sidewalls. Of course in any constitution of the rib 14, the conductive material layer is connected to the upper common electrode 12 of the organic EL device, so as to be composed as an auxiliary wiring of the upper common electrode 12. And since the rib 14 is formed so as to have a top surface of which higher in the level than the organic layers 11R, 11G, 11B, that the rib 14 can be used as a spacer for the metal mask 20 for defining the pattern during evaporation of such organic layers 11R, 11G, 11B.

Figure 9:
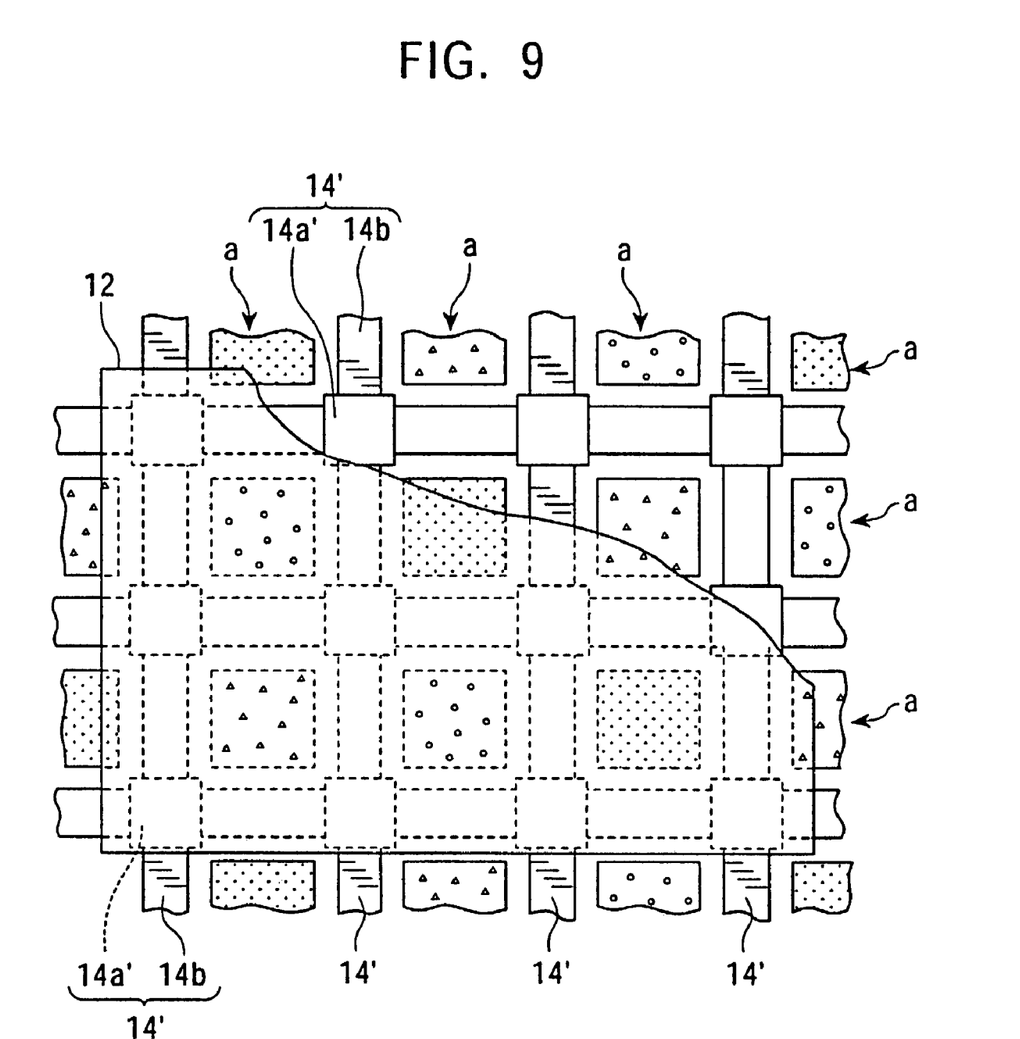
FIG. 9 is a plan view of an essential part of another display apparatus according to another embodiment of the present invention.

FIG. 9 is a schematic plan view showing a display area of an organic EL display apparatus according to another embodiment of the present invention.

The organic EL display apparatus shown in FIG. 9 differs from the apparatus shown in FIGS. 1 and 2 in that the rib 14' has a double-layered structure in which an insulating material layer 14a' having an island pattern and a conductive material layer 14b used as an auxiliary wiring, while the remaining portions are the same.

That is, between every adjacent pixels "a" of the organic EL display apparatus, the conductive material layer 14b is provided in a lattice form, and on every crossing of the lattice an insulating material layer 14a' patterned in an island form is provided.

The height of the rib 14' which is expected to serve as a spacer is ensured by the insulating material layer 14a', wherein the sidewalls of the insulating material layer 14a' being formed in a tapered form so as to allow a desirable coverage of the upper common electrode 12 covering such insulating material layer 14a'.

Also in the organic EL display apparatus having the thus-constituted rib 14', the voltage drop of the upper common electrode 12 within the display area can be suppressed since the upper common electrode 12 made of a high-resistivity transparent conductive material is connected to the conductive material layer 14b as an auxiliary wiring provided over the entire display plane. Thus a sufficient luminous intensity of the organic EL devices 9 of the individual pixels "a" within the display plane is ensured. The stacked portion of the insulating material layer 14a' and the conductive material layer 14b of the rib 14' can serve as a spacer for the mask for patterning the organic layers 11R, 11G, 11B, so that there is no need to separately provide the spacer and the auxiliary wiring between every adjacent pixels. This allows space saving between every adjacent pixels and reserve of the pixel area. Thus similarly to the organic EL display apparatus as described in the previous embodiment, the active-matrix organic EL display apparatus of the top emission type can be improved in the display property.

Since the height of the portion of the rib 14' intended for use as a spacer is ensured by the insulating material layer 14a', fabrication of such spacer portion in need of having a certain height can easily be formed. In addition, since the insulating material layer 14a' is patterned into an island form, that the area occupied by the spacer portion in need of having a certain height (and therefore in need of having a certain degree of the bottom area) can be reduced. This allows the conductive material layer 14b to be formed with a narrower pattern width between every adjacent pixels "a", which can expand the pixel area and improve the display property.

While the above description was made on the rib 14' composed of the conductive material layer 14b and the island-patterned insulating material layer 14a' formed thereon, another possible case relates to the rib 14' composed of the island-formed insulating material layer and the conductive material layer overlaps at a part thereof.

Although the invention has been described in its preferred form with a certain degree of particularity, obviously many changes and variations are possible therein. It is therefore to be understood that the present invention may be practiced otherwise than as specifically described herein without departing from the scope and the sprit thereof.

What is claimed is:

1. A method for fabricating a display apparatus having a plurality of pixels, the method comprising the steps of:
   forming on a substrate a first electrode;
   forming between adjacent ones of said plurality of pixels a rib having a conductive material, said rib being aligned substantially normal to the substrate;
   placing a mask on said rib, said mask being aligned substantially parallel to said substrate, and forming on said first electrode a light emitting layer smaller in thickness than said rib using said mask; and
   forming a second electrode on said light emitting layer and on and over said rib.

2. The method for fabricating a display apparatus as claimed in claim 1, wherein said rib is made of an insulating material and a conductive material.

3. The method for fabricating a display apparatus as claimed in claim 1, wherein said rib is formed so as to have a mesa-formed section such that the width of which becomes wider toward said substrate.

4. The method for fabricating a display apparatus as claimed in claim 2, wherein said rib is formed so as to have a mesa-formed section such that the width of which becomes wider toward said substrate.

5. The method for fabricating a display apparatus as claimed in claim 1, further comprising the steps of:
   forming on said second electrode a protective film made of an insulating material or a conductive material; and
   adhering on said protective film a second substrate using a photo-curing resin.

6. The method for fabricating a display apparatus as claimed in claim 1, further comprising a step of forming an insulating film under said rib.

7. The method for fabricating a display apparatus as claimed in claim 1, wherein said rib is formed in an island form in the step for forming said rib.

8. The method for fabricating a display apparatus as claimed in claim 1, wherein said second electrode and said conductive material are made of different materials.

9. The method for fabricating a display apparatus as claimed in claim 1, wherein said first electrode is higher in reflectivity of light than said second electrode.

10. The method for fabricating a display apparatus having a plurality of pixels, the method comprising the steps of:
    forming on a substrate a field effective transistor having a first electrode, a second electrode and a third electrode;
    forming on said field effective transistor an interlayer insulating film;
    forming an opening to said interlayer insulating film;
    forming on said interlayer insulating film on a lower electrode connected through said opening to said first electrode;
    forming between adjacent ones of said plurality of pixels a rib having a conductive material, said rib being aligned substantially normal to said substrate;
    placing a mask on said rib, said mask being aligned substantially parallel to said substrate, and forming on said lower electrode an organic layer having a light emitting layer smaller in thickness than said rib using said mask; and
    forming on and over said said rib and said organic layer an upper electrode and a protective layer made of an insulating material or a conductive material while keeping said organic layer unexposed to the air.

11. The method for fabricating a display apparatus as claimed in claim 10, wherein said rib is made of an insulating material and a conductive material.

12. The method for fabricating a display apparatus as claimed in claim 10, wherein said rib is formed so as to have a mesa-formed section such that the width of which becomes wider toward said substrate.

13. The method for fabricating a display apparatus as claimed in claim 11, wherein said rib is formed so as to have a mesa-formed section such that the width of which becomes wider toward said substrate.

14. The method for fabricating a display apparatus as claimed in claim 10, further comprising a step of adhering on said protective film a second substrate using a photo-curing resin.

15. The method for fabricating a display apparatus as claimed in claim 10, further comprising a step of forming an insulating film under said rib.

16. The method for fabricating a display apparatus as claimed in claim 10, wherein said rib is formed in an island form in the step for forming said rib.

17. The method for fabricating a display apparatus as claimed in claim 10, wherein said upper electrode and said conductive material layer are individually made of different materials.

18. The method for fabricating a display apparatus as claimed in claim 10, wherein said lower electrode is higher in reflectivity of light than said upper electrode.

* * * * *